(12) United States Patent
Sindledecker

(10) Patent No.: US 6,409,448 B1
(45) Date of Patent: Jun. 25, 2002

(54) ERGONOMIC LOAD PORT

(75) Inventor: Glenn L Sindledecker, Dracut, MA (US)

(73) Assignee: Brooks Automation Inc., Chelmsford, MA (US)

( * ) Notice: Subject to any disclaimer, the term of this patent is extended or adjusted under 35 U.S.C. 154(b) by 0 days.

(21) Appl. No.: 09/541,284

(22) Filed: Apr. 3, 2000

(51) Int. Cl.[7] ............................................... B65G 49/07
(52) U.S. Cl. ........................... 414/222.04; 414/217.1; 414/940
(58) Field of Search ..................... 414/217.1, 222.04, 414/589, 590, 754, 939, 940

(56) References Cited

U.S. PATENT DOCUMENTS 5,895,191 A * 4/1999 Bonora et al. ............... 414/217
6,318,953 B1 * 11/2001 Bonora et al. ............... 414/754

* cited by examiner

Primary Examiner—Janice L. Krizek
(74) Attorney, Agent, or Firm—Perman & Green, LLP

(57) ABSTRACT

A load port module is mounted adjacent a process tool for loading semiconductor wafers to the process tool and unloading them from the process tool. The module includes a mounting frame having a charging opening therein for entry into the process tool, a platform having an upper surface for supportively receiving a cassette containing the semiconductor wafers to be passed though the charging opening into the process tool, a selectively operable closure movable between a first position withdrawn from the charging opening allowing the passage therethrough of the semiconductor wafers and a second position overlying the charging opening preventing the passage therethrough of the semiconductor wafers, and a shroud movable between a retracted position fully exposing the platform and its associated cassette and an advanced position fully encompassing the platform and the cassette adjacent the process tool. The shroud serves as a barrier against the passage of particulate matter into the process tool. In one instance, the platform includes a tilt assembly for moving a cassette receiving cradle with the cassette thereon from the first location to a second location at the reception region into the process tool such that the plurality of wafers are then supported in a substantially level orientation. In another instance, the platform is movable in plane between a withdrawn position distant from the charging opening and an advanced position proximate the charging opening.

26 Claims, 13 Drawing Sheets

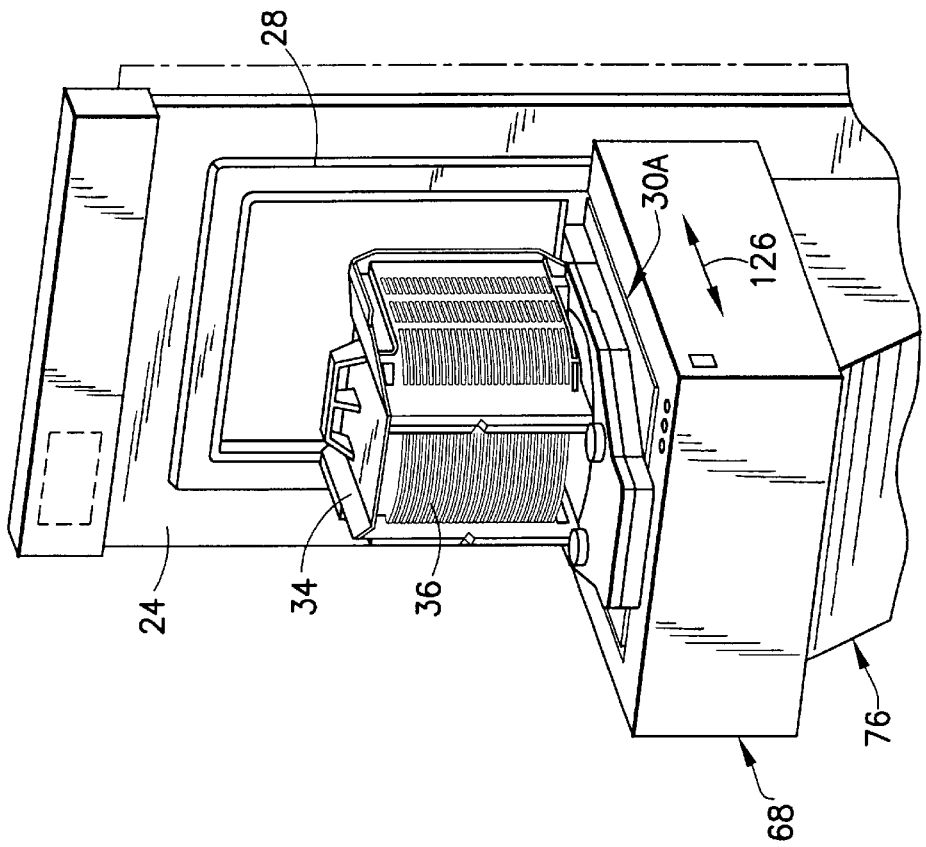
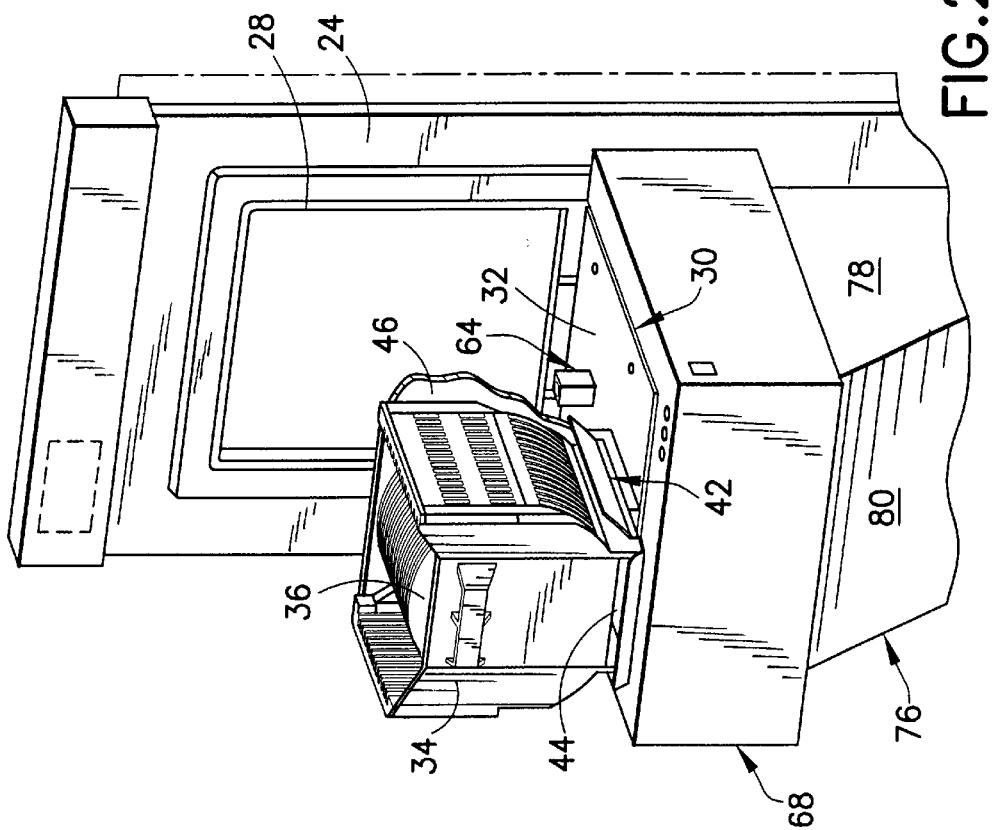

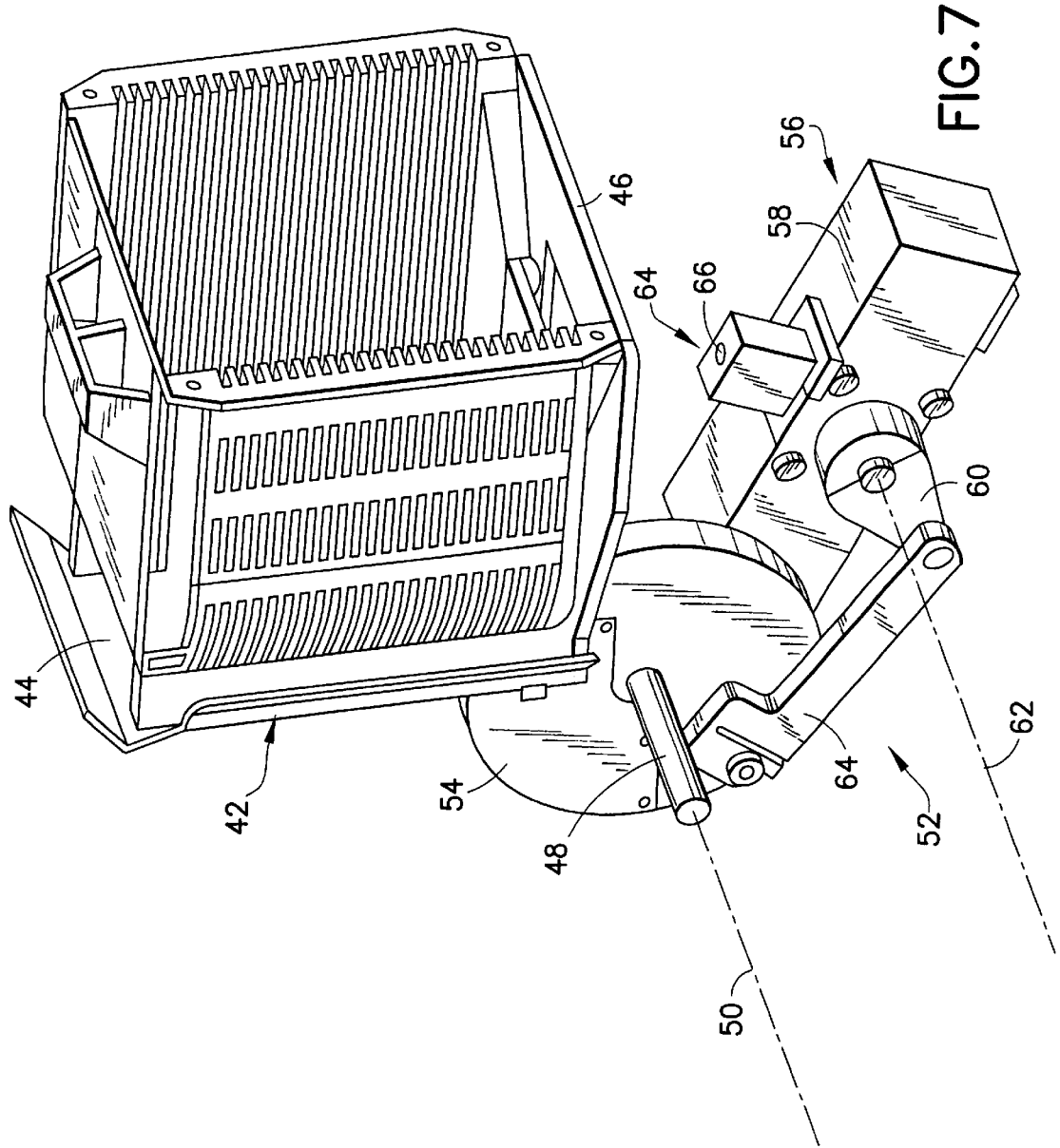

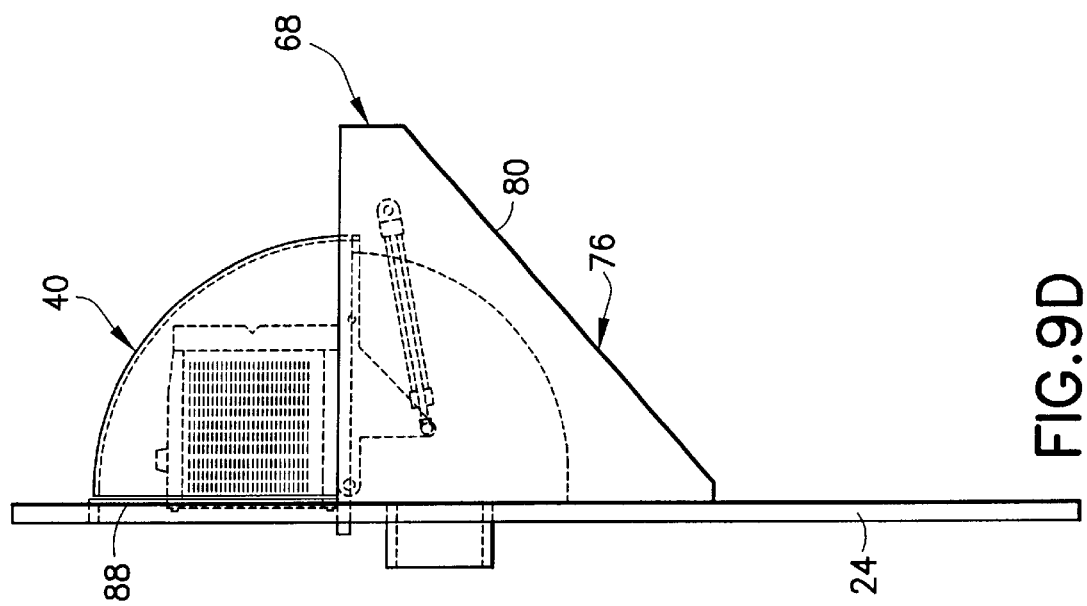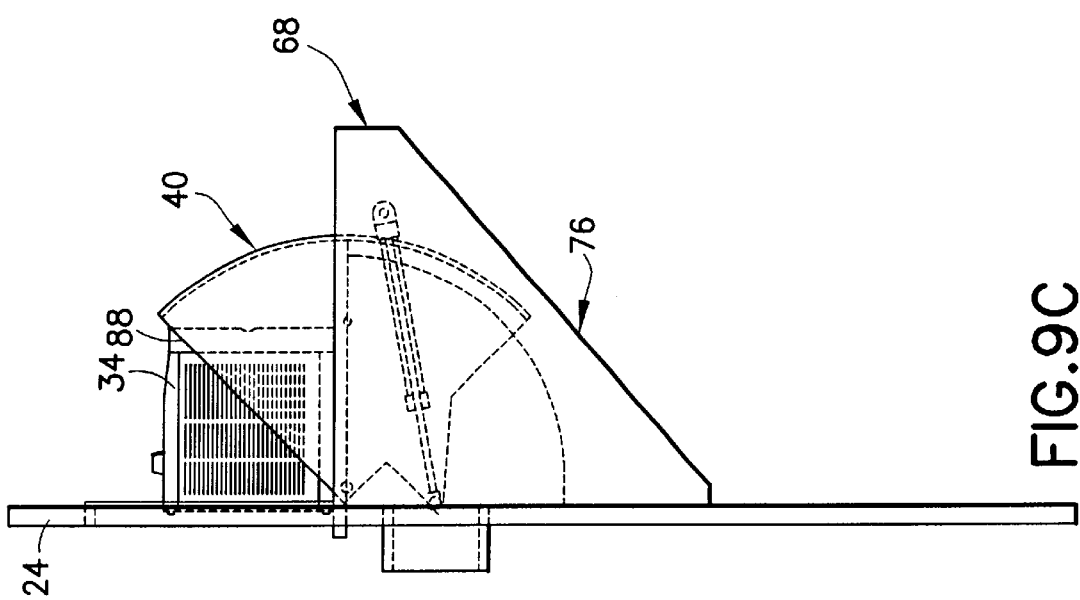

ERGONOMIC LOAD PORT

BACKGROUND OF THE INVENTION

1. Field of the Invention

The present invention relates to a loading and unloading station for semiconductor processing installations with a closeable charging opening through which wafer-shaped or disk-shaped objects which are accommodated in a transporting container can be loaded, unloaded and reloaded after removing a closure.

2. Description of the Prior Art

For the purpose of charging semiconductor processing installations, it is known to use so-called SMIF boxes as magazine containers with a relatively small enclosed volume in which wafer magazines can be stored and transported. The box can be placed on an opening mechanism in an enclosure or housing which encloses one or more work stations so as to keep them free of dust. The box and opening mechanism have closing elements which are adapted to one another and which can be opened simultaneously one above the other so that dust particles resting on the outside of the closing elements can be enclosed therebetween when the wafer magazines are lowered into the housing together with the two closing elements. The box itself encloses the opening formed in the housing.

A loading and unloading device according to the German Patent 43 26 309 C1, for example, or a device having another operating sequence serves to remove the magazines from the transporting containers and place them in the processing installation. After the semiconductor wafers are processed, the magazines are transported back in the transporting containers.

The technique of SMIF boxes is especially suited for semiconductor wafers with smaller diameters, as is conventional. In view of the material characteristics of the semiconductor wafers, these SMIF boxes and the wafer magazines used with them are becoming increasingly unsuitable as transporting containers as the diameter of semiconductor wafers increases.

Transporting containers which take over the function of magazines at the same time are already known for semiconductor wafers of this type. Loading, unloading and reloading of the semiconductor wafers is effected individually in a plane parallel to the surface of the semiconductor wafers, wherein the transporting container can be closed by a container cover extending substantially at right angles to the loading and unloading plane. Accordingly, in contrast to the SMIF box, the container cover is removed and inserted laterally rather than in a downward direction.

Since the transporting containers are enclosed by a space with low requirements, as regards cleanness and since there are no magazines which can be loaded and unloaded such as those used in the SMIF technique, the charging of semiconductor processing installations proceeding from these transporting containers and the transporting back from such installations into the transporting containers presents problems. Moreover, the problem is exacerbated in that optional loading and unloading into and out of a greater number of transporting containers must be ensured under certain circumstances and the containers themselves must be supplied and removed by operating personnel under favorably ergonomic conditions.

An arrangement for storing, transporting and inserting substrates is known from EP 542 793 B 1. In this arrangement, a cassette with a lateral closing cap is arranged opposite a loading slot. The cassettes are brought into the loading position one after the other by a lifting plate which can hold a packet of stacked cassettes. When this position is reached, the closing cap is swiveled open at one edge and the substrate wafer is inserted into the clean room by a drawer which can travel out of the cassette. An air flow exiting from the loading slot prevents particles from penetrating into the clean room in that it passes through an open gap between a protruding seal and the cassette.

A significant improvement over the foregoing concepts has been presented in U.S. Pat. No. 5,772,386 to Mages et al., the entire disclosure of which is incorporated herein by reference.

It was with knowledge of the foregoing state of the technology that the present invention has been conceived and is now reduced to practice.

SUMMARY OF THE INVENTION

The present invention relates to a load port module which is mounted adjacent a process tool for loading semiconductor wafers to the process tool and unloading them from the process tool. The module includes a mounting frame having a charging opening therein for entry into the process tool, a platform having an upper surface for supportively receiving a cassette containing the semiconductor wafers to be passed though the charging opening into the process tool, a selectively operable closure movable between a first position withdrawn from the charging opening allowing the passage therethrough of the semiconductor wafers and a second position overlying the charging opening preventing the passage therethrough of the semiconductor wafers, and a shroud movable between a retracted position fully exposing the platform and its associated cassette and an advanced position fully encompassing the platform and the cassette adjacent the process tool. The shroud serves as a barrier against the passage of particulate matter into the process tool. In one instance, the platform includes a tilt assembly for moving a cassette receiving cradle with the cassette thereon from the first location to a second location at the reception region into the process tool such that the plurality of wafers are then supported in a substantially level orientation. In another instance, the platform is movable in plane between a withdrawn position distant from the charging opening and an advanced position proximate the charging opening.

The present invention has resulted from a semiconductor industry requirement for an ergonomic system to safely load cassettes of wafers into processing equipment allowing for transporting and placing the cassettes onto the equipment with the wafers either in the vertical or in the horizontal orientation. In the former instance, the wafer cassettes need to be rotated to the horizontal position for access by standard pick and place robots and this rotation must be accomplished with minimum jarring or abrupt motion to avoid wafer damage or ejection from the cassette. In the latter instance, the wafer cassettes need only be moved from a withdrawn position to an advanced position.

In all instances, the wafers must be protected during processing from fine particulate contamination. Additionally, when the conventional protective cover of the process tool is open, there is a potential human hazard from robotic handling units to which the load port module of the invention attaches. Further, the environment needs to be contained for cleanliness when the cover is open. Accordingly, the load port module of the invention includes an automated door which assures these goals.

A primary feature, then, of the present invention is the provision of an improved loading and unloading station for semiconductor processing installations with a closeable charging opening through which wafer-shaped or disk-shaped objects which are accommodated in a transporting container can be loaded, unloaded and reloaded after removing a closure.

Another feature of the present invention is the provision of such a loading and unloading station which accepts wafers either in a vertical orientation or in a horizontal orientation and, in the event they are in the vertical orientation, carefully rotates them to the horizontal orientation to enable their removal from and replacement into the cassette using conventional robot apparatus.

Still another feature of the present invention is the provision of such a loading and unloading station which employs an automated tilting mechanism for ergonomic handling of wafer cassettes utilizing the acceleration and deceleration curves provided with a 180° crank shaft motion.

Yet another feature of the present invention is the provision of such a loading and unloading station which employs a protective shroud to close over wafers preventing contamination during processing while allowing visibility after wafers are loaded.

Still a further feature of the present invention is the provision of such a loading and unloading station in which rotational closure of the shroud does not interfere with process equipment behind the loading station and occupies minimum space.

Yet a further feature of the present invention is the provision of such a loading and unloading station which can mount to a semi-standard SEMI E63 BOLTS-M interface (Box Opener/Loader to Tool Standard) enabling use with the latest equipment designed for 300 mm wafers to be tested or used with alternate wafer sizes.

Still another feature of the present invention is the provision of such a loading and unloading station which provides for the port door to close the mini-environment when the shroud is open for personnel safety and to contain the mini-environment.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and together with the description, serve to explain the principles of the invention in general terms. Like numerals refer to like parts throughout the disclosure.

BRIEF DESCRIPTION OF THE DRAWINGS

The foregoing aspects and other features of the present invention are explained in the following description, taken in connection with the accompanying drawings, wherein:

FIG. 2 is a detail perspective view of the load port module of FIG. 1 with the shroud in the retracted position exposing a cassette containing a plurality of semiconductor wafers in an upright orientation positioned near a charging opening for entry into the process tool;

FIG. 2A is a detail perspective view, similar to FIG. 2 with the shroud in the retracted position, but exposing a cassette containing a plurality of semiconductor wafers in a horizontal orientation positioned near a charging opening for entry into the process tool;

FIG. 7 is a perspective view of a tilt assembly for moving a cassette cradle with the cassette supported thereon from a first location depicted in FIG. 2 at which the semiconductor wafers are supported in a substantially upright orientation to a second location adjacent the process tool at which the wafers are supported in a substantially level orientation;

FIGS. 9A, 9B, 9C, and 9D are side elevation views, partially cut away in some instances, of the embodiment illustrated in FIG. 2 and illustrating successive positions of its components;

DETAILED DESCRIPTION OF THE PREFERRED EMBODIMENT

Figure 1:
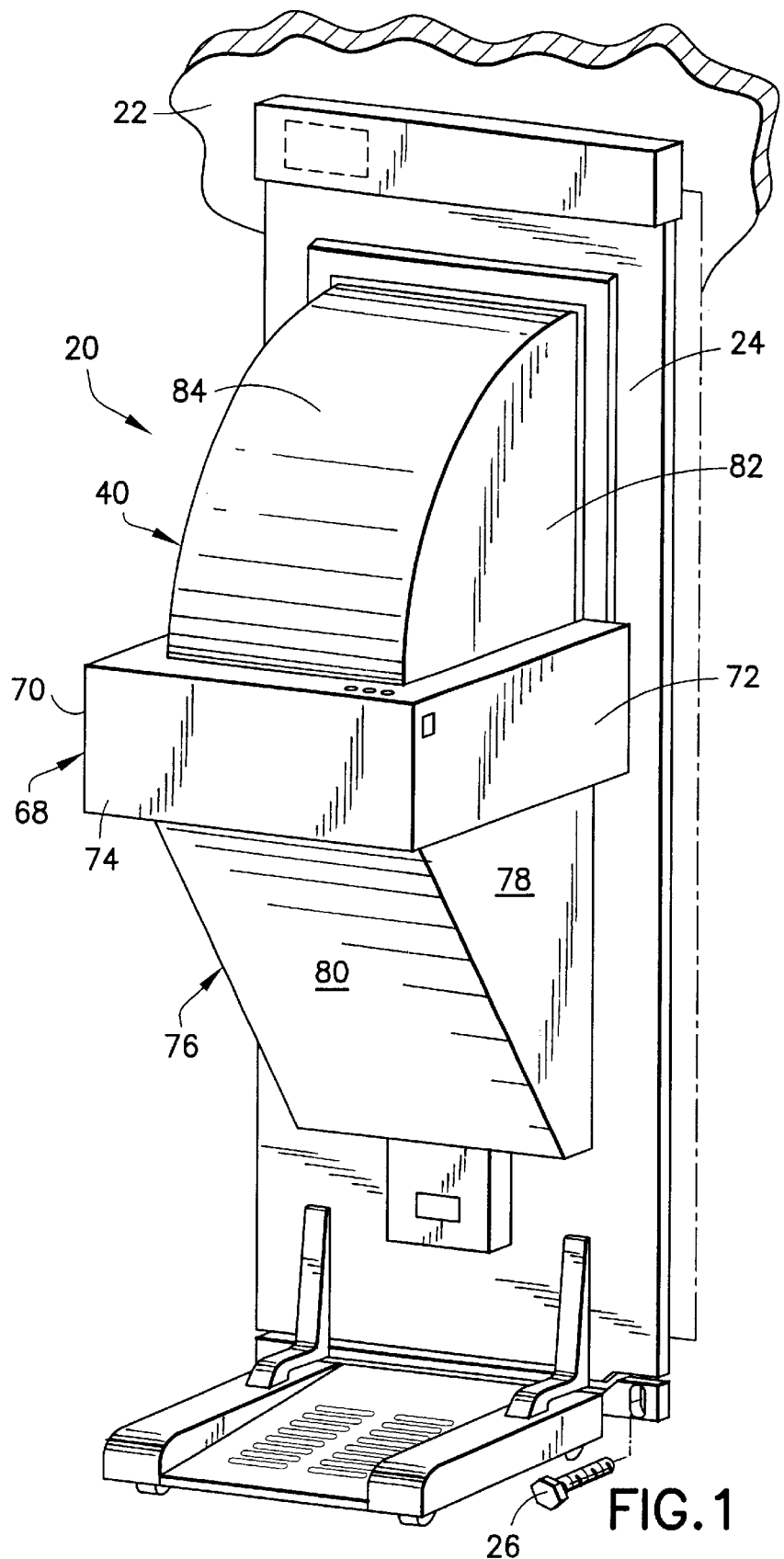
FIG. 1 is a perspective view of a load port module for loading and unloading semiconductor wafers adjacent a process tool illustrating a cassette covering shroud in an advanced position.
Figure 3:
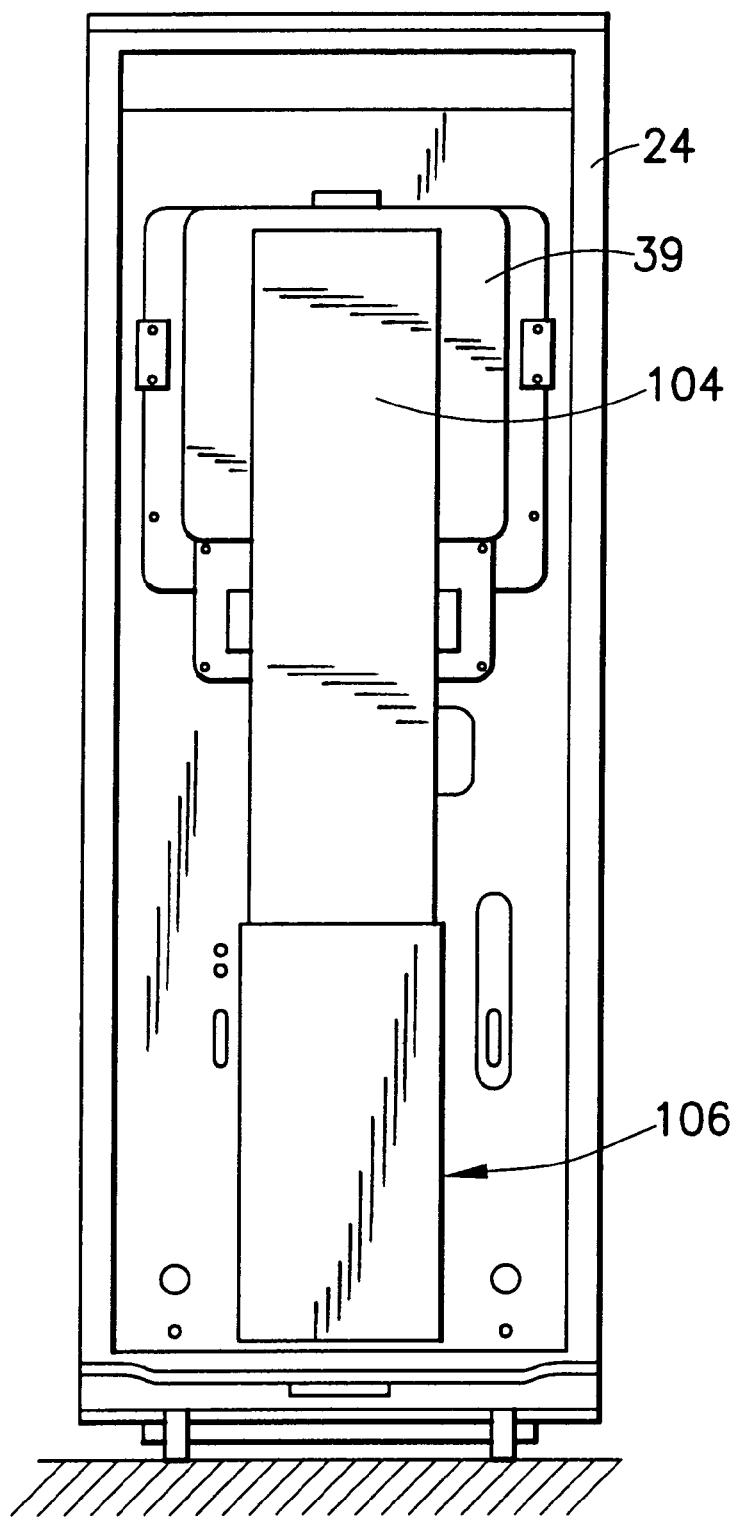
FIG. 3 is a rear elevational view of the load port module illustrated in FIG. 1.
Figure 4:
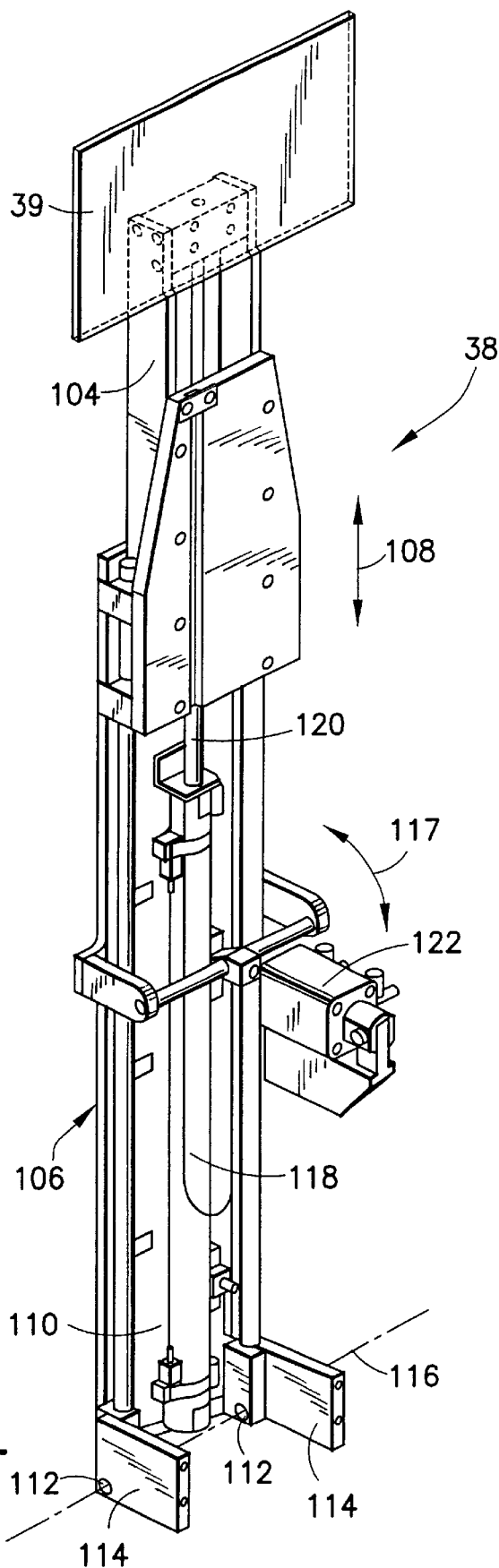
FIG. 4 is a detail perspective view of components illustrated in FIG. 3.

Referring to FIG. 1, there is shown a perspective view of a load port module 20 incorporating features of the present invention. Although the present invention will be described with reference to the embodiments shown in the drawings, it should be understood that the present invention can be embodied in many alternate forms. In addition, any suitable size, shape or type of elements or materials could be used. The load port module 20 is intended to be releasably mounted in any suitable manner adjacent a process tool 22 for loading and unloading, respectively, semiconductor wafers to and from the process tool.

More specifically, the load port module 20 includes a mounting frame 24 (FIGS. 1 and 2) for attachment to the process tool 22 as by bolts 26 and having a charging opening 28 (FIG. 2) therein for entry into the process tool. For this purpose, it is desirable for the charging opening 28 to be generally aligned with a similarly sized and shaped aperture (not shown) leading into the process tool.

With continued attention to FIGS. 1 and 2 for the description of a first embodiment of the invention, the load port module 20 includes a platform 30 having an upper surface 32 for receiving thereon a cassette 34 adapted to support therein in a known manner a plurality of semiconductor wafers 36 to be passed though the charging opening 28 and into the process tool 22.

Turning now to FIGS. 3, 4, 5, and 6, the load port module 20 also includes a selectively operable closure 38 movable between a first position (FIG. 5) withdrawn from the charging opening 28 and allowing the passage therethrough of the semiconductor wafers 36 and a second position (FIG. 6) overlying the charging opening and preventing the passage therethrough of the semiconductor wafers.

The load port module 20 also includes a shroud 40 movable between a retracted position (FIG. 2, not seen) fully exposing the upper surface 32 of the platform 30 and the cassette 34 received thereon and an advanced position (FIG. 1) fully encompassing the upper surface of the platform and the cassette received thereon adjacent the process tool 22 to serve as a barrier against the passage of particulate matter into the process tool.

With reference now especially to FIG. 7, the platform 30 includes a flanged cassette cradle 42 with a base 44 on and contiguous with the upper surface 32 (FIG. 2) for initially receiving the cassette 32 thereon. A back wall 46 integral with the base 44 extends in a plane transverse to the base and an arbor 48 (FIG. 7) which, fixed at its ends to inside regions of a stage 68, pivotally mounts the cassette cradle about an axis 50 parallel to a line of intersection between the base 44 and the back wall 46 for moving the cassette 34 between a first location (FIG. 7A) at which the semiconductor wafers are supported in a substantially upright orientation and a second location (FIG. 7D) at which the cassette is supported on the back wall 46. At intermediate locations, support of the cassette 34 is shared by the base 44 and the back wall 46.

A tilt assembly 52 is employed for moving the cassette cradle 42 with the cassette 34 supported thereon from the first location (FIG. 7A) at which the semiconductor wafers are supported in a substantially upright orientation to a second location (FIG. 7D) at the reception region into the process tool such that the plurality of wafers are then supported in a substantially level orientation. The tilt assembly 52 includes a cassette cradle crank 54 interconnecting the cassette cradle and the arbor 48. The cassette cradle crank 54 is illustrated as being generally disk-shaped although it may be of any other suitable configuration. An actuating mechanism 56 serves to rotate the cassette cradle crank 54 about the axis 50 of the arbor 48. More specifically, the actuating mechanism 56 includes a rotary actuator 58, a drive link 60 driven by the rotary actuator about a drive axis 62 parallel to and spaced from the arbor axis 50, and a connecting link 64 pivotally connected at opposed ends, respectively, to the cassette cradle crank 54 at a position spaced from the arbor axis and to the drive link at a position spaced from the drive axis.

By reason of the construction just described, the actuating mechanism 56 is effective to move the cassette cradle through an arcuate sweep of 90° between the first and second positions in response to rotation of the drive link through an arcuate sweep of 180°. This provides a sinusoidal acceleration/deceleration through the tilt motion using an essentially constant speed drive without the need for servo controls. This prevents the wafers from being jarred or ejected during the tilt operation. Additionally, the actuating mechanism 56 includes a cassette down sensor 64, mounted on the rotary actuator 58 or otherwise suitably mounted, responsive to arrival of the cassette cradle at the second location for terminating operation of the rotary actuator. The sensor 64 may, for example, include a properly positioned microswitch 66 operable when engaged by the back wall 46.

Turn now to FIG. 8, FIGS. 9A–9D, and FIGS. 10A–10D for a more complete description of the construction and operation of the shroud 40. At the outset, it should be explained that the load port module 20 includes a stage 68 having opposed side walls 70, 72 and an integral front wall 74 fixed on the mounting frame 24 and extending away from the mounting frame adjacent the charging opening 28. A shroud enclosure 76 is fixed to the mounting frame 24 and to the stage 68 and includes opposed side walls 78 and an inclined front wall 80. The side walls 78 of the shroud enclosure 76 are generally parallel to and spaced from opposed parallel side quarter panels 82 of the shroud 40 and the front wall 80 of the shroud enclosure is adequately spaced from an arcuate cover panel 84 when the shroud is in a retracted position to enable its operation in a manner to be described.

Figure 9B:
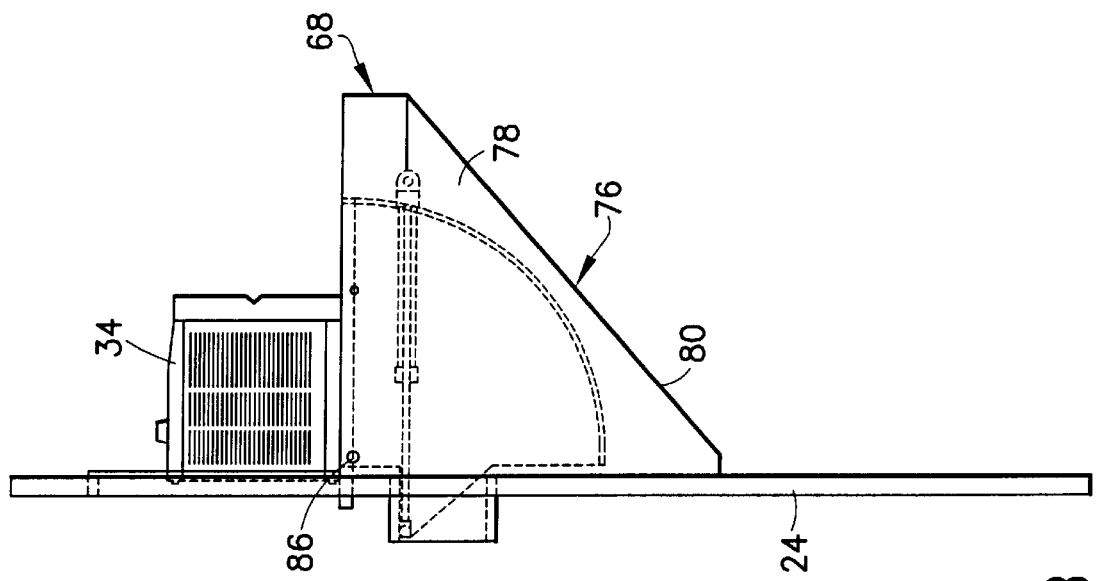
Figure 9A:
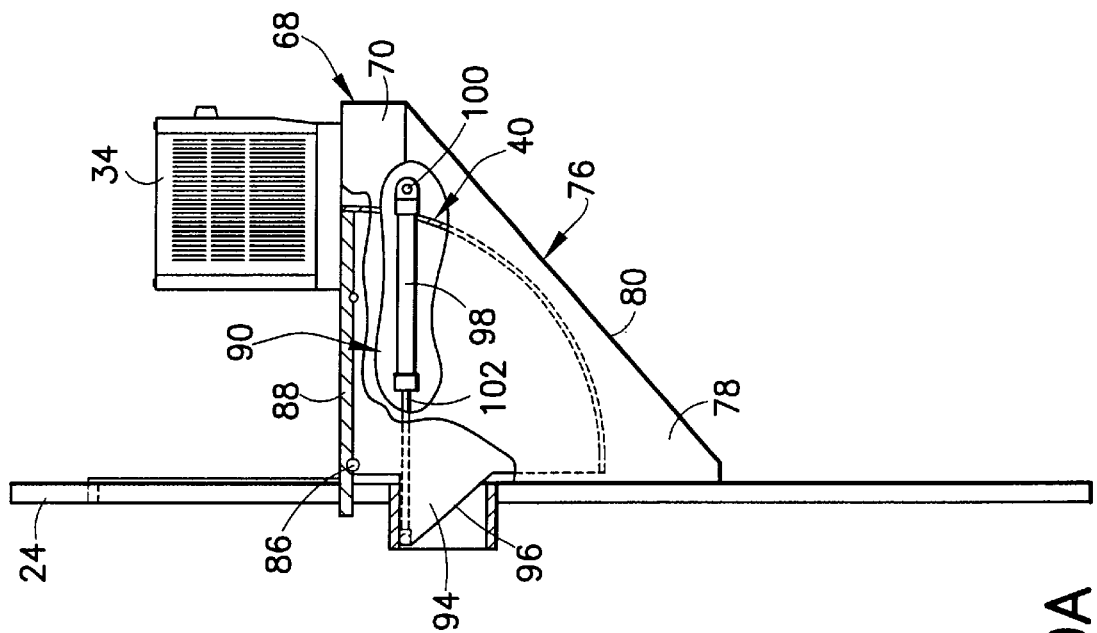
Figure 10A:
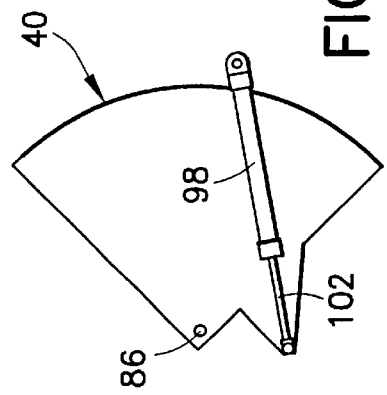
FIGS. 10A, 10B, 10C, and 10D are detail diagrammatic side elevations views illustrating successive positions of the cassette covering shroud and its operating components.
Figure 10B:
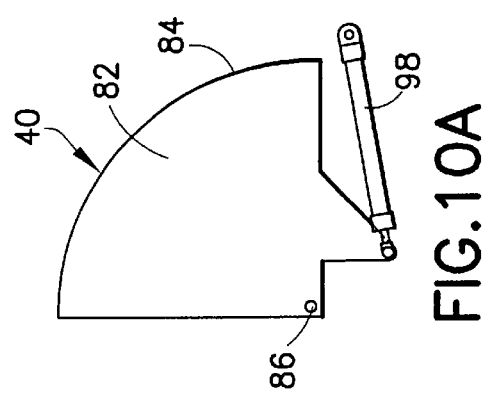
Figure 10C:
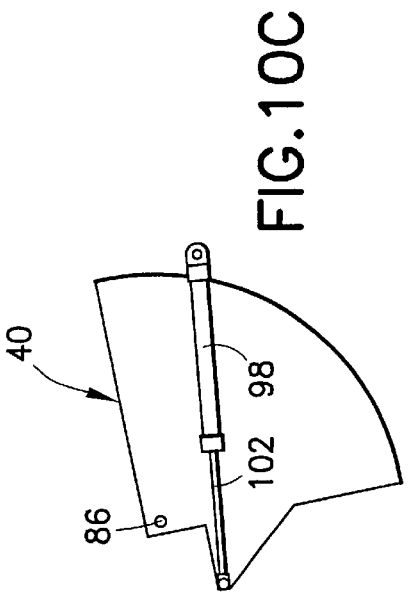
Figure 10D:
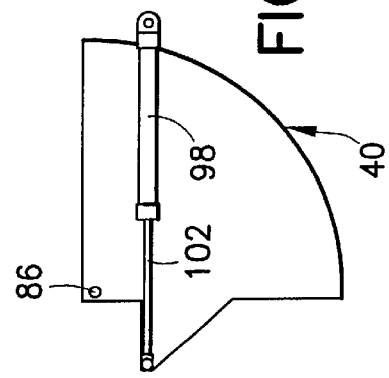
Figure 11:
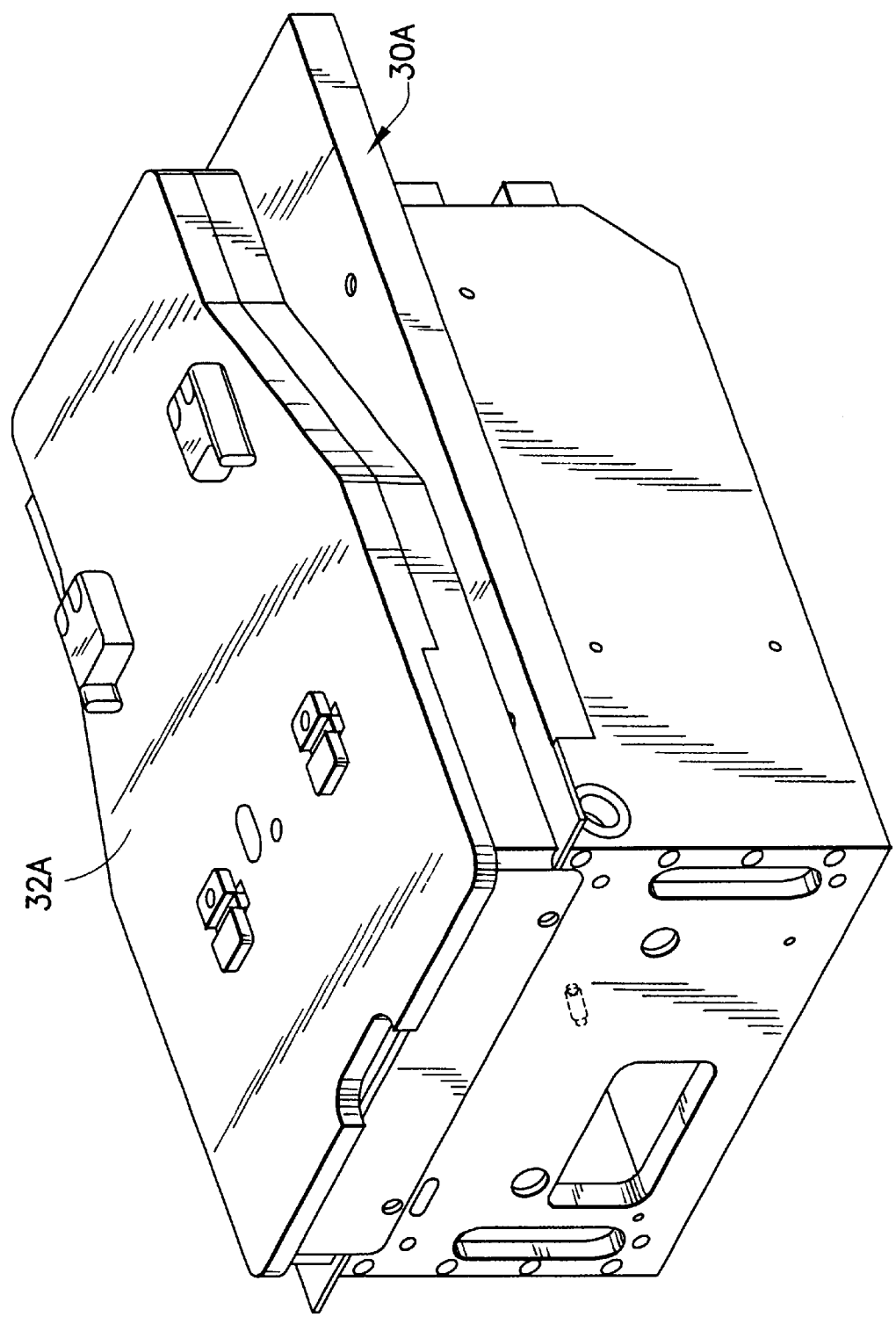
FIG. 11 is an upper perspective view of a modified platform consistent with the FIG. 2A embodiment.

As just noted, the shroud includes a pair of substantially parallel side quarter panels 82 and an arcuate cover panel 84 which is integral with and extends between the side quarter panels. Suitable hinges 86 pivotally mount the side quarter panels 82 to the side walls 70, 72, respectively, of the stage 68 adjacent the charging opening 28. Together, the side quarter panels 82 and the arcuate cover panel 84 define a foremost rim 88 (FIGS. 9A–9D and 10A—10D). The foremost rim 88 is substantially coplanar with the upper surface 32 of the platform 30 (FIG. 2) when the shroud is in the retracted position as indicated by a solid line in FIG. 8 and also as indicated in FIGS. 9A, 9B, and 10D. However, the foremost rim is proximate the mounting frame 24 and surrounds the charging opening 24 when the shroud is in the advanced position as indicated in FIGS. 1, 9D, and 10A.

An actuator mechanism 90 is employed for moving the shroud 40 between the retracted position and the advanced position. For this purpose, the side quarter panels 82 and the arcuate cover panel 84 together define an aft rim 92 distant from the foremost rim 88 and include an operating flange 94 integral with one of the side quarter panels and extending away from the aft rim to an extreme edge 96. A shroud actuator 98 is pivotally mounted at 100 on the stage 68 with an actuator rod 102 pivotally connected to the operating flange 94 adjacent the extreme edge 96. With this construction, operation of the shroud actuator 98 effects movement of the shroud 40 between the retracted position (FIGS. 9A, 9B, and 10D) and the advanced position (FIGS. 9D and 10A) and passing through the intermediate positions depicted in FIGS. 9C, 10B, and 10C.

It will be appreciated that in FIG. 9A, the cassette is depicted as just having been placed onto the cassette cradle 42 (FIG. 2) toward the front of the platform 30 and with the semiconductor wafers 36 in an upright orientation. In FIG. 9B, the actuating mechanism 56 has been operated to move the cassette 34 to a position adjacent the charging opening 28 and with the semiconductor wafers 36 in a substantially horizontal orientation. It is only when the cassette 34 is in the latter position that the closure operation of the shroud 40 is initiated.

Returning now to FIGS. 3–6 for a more complete description of the closure 38, the load port module 20 further includes an arm 104 on which is mounted the closure 38. The arm 104 is operable to move the closure 38 between the positions depicted, respectively in FIGS. 5 and 6. Indeed, the arm 104 is movable in at least two different directions angled relative to each other so as to move the closure in the at least two different directions. More specifically, in one instance, the arm 104 is slidably movable longitudinally on an upright column 106 in up and down directions as indicated by a double headed arrow 108. With this construction, it can be said that the arm is longitudinally movably connected to the frame 24.

Additionally, a base 110 of the column 106 is pivotally hinged as at pivot locations 112 to block members 114 which, in turn, are suitably fastened to the lower regions of the mounting frame 24. With this construction, in another instance, the arm 104 can be said to be rotatably connected to the frame 24 and this construction enables the arm to pivot about a laterally directed axis 116 in the manner generally depicted by a double headed arrow 117.

Figure 6:
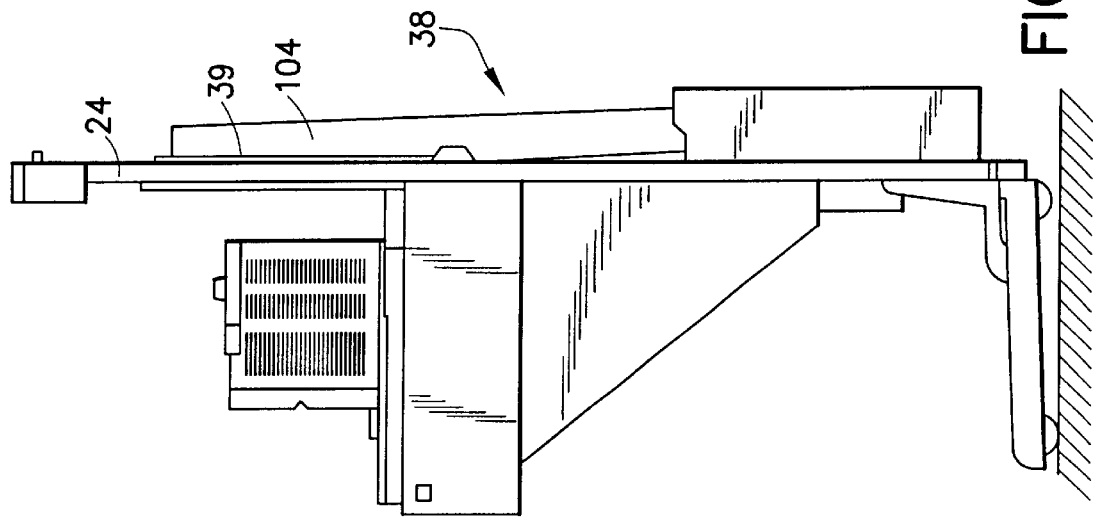
FIGS. 5 and 6 are side elevation views of the load port module illustrated in FIG. 1 depicting different positions, respectively, of operating components.
Figure 5:
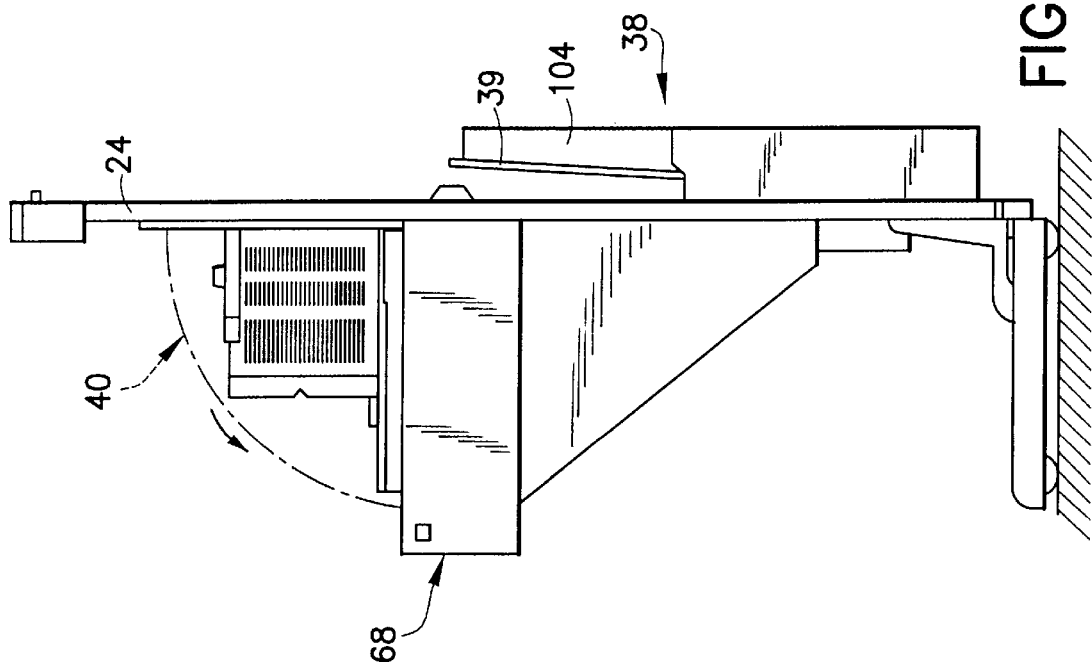
Figure 7A:
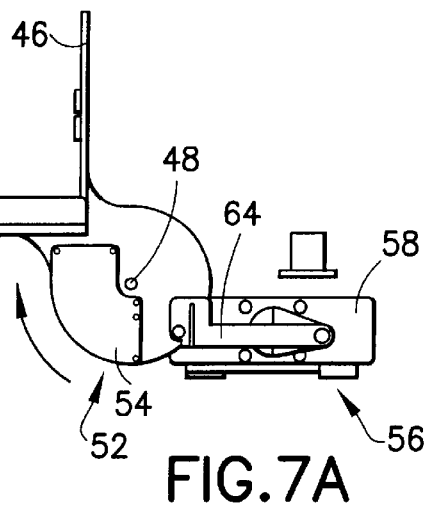
FIGS. 7A through 7D are detail side elevation views of the tilt assembly of FIG. 7 illustrating successive positions thereof.
Figure 7B:
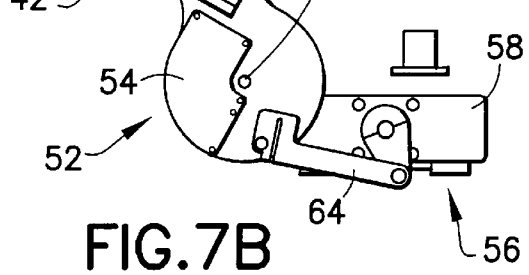
Figure 7C:
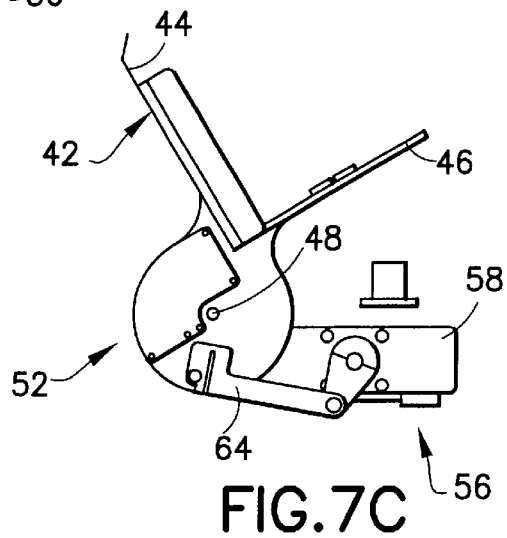
Figure 7D:
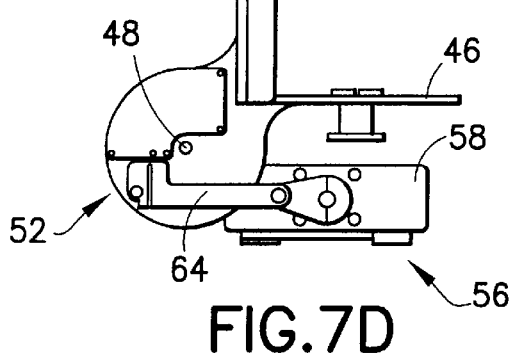
Figure 8:
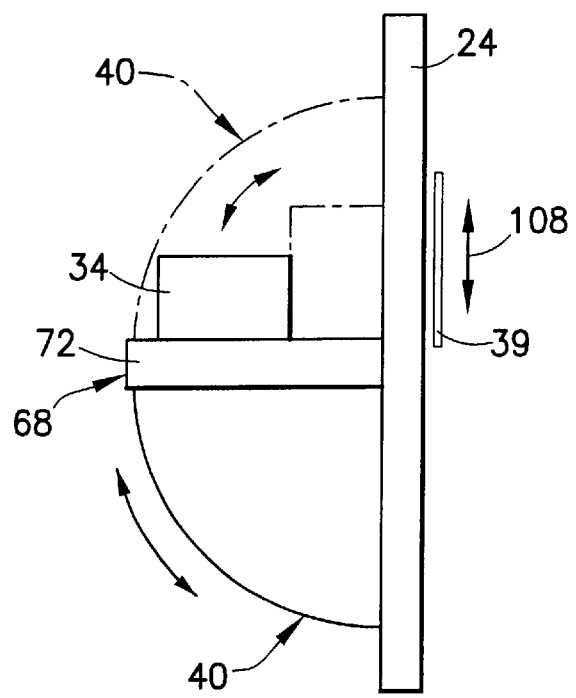
FIG. 8 is a detail diagrammatic side elevation view of one embodiment of the load port module of the invention and illustrating the movement of its operating components.
Figure 8A:
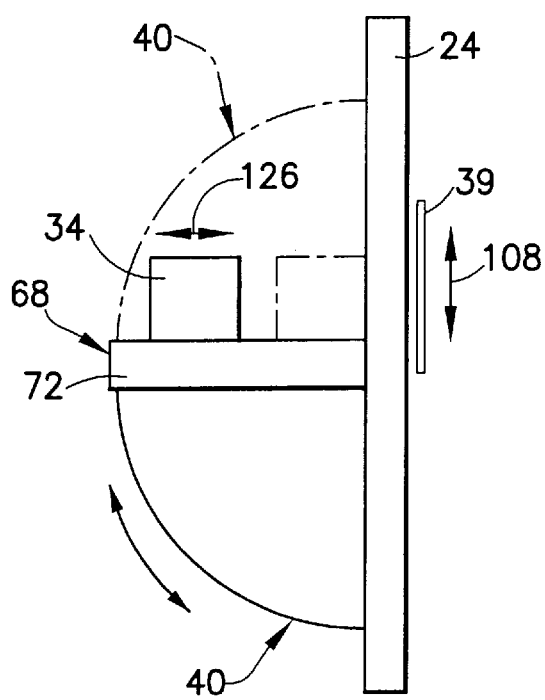
FIG. 8A is a detail diagrammatic side elevation view, similar to FIG. 8, of another embodiment of the load port module of the invention and illustrating the movement of its operating components.

An elevational actuator 118 is fixed on the upright column 106 and via associated actuator rod 120 raises and lowers the closure 38 in the manner depicted by the double headed arrow 108 between the respective positions illustrated in FIGS. 5 and 6. A swing actuator 122 is suitably fixed on the mounting frame 24 and in a suitable manner operably connected to the upright column 106 to effect rotation of the upright column and of the arm 104 mounted thereon about the axis 116 in the manner depicted by the double headed arrow 117. The actuators 118, 122 operate in a combined manner such that as the closure 38 is moved from the FIG. 5 position to the FIG. 6 position, the closure is not only raised but moved into a contiguous relationship with that region of the mounting frame 24 surrounding the charging opening 28. With this construction and operation, the integrity of the interior of the process tool 22 is assured.

Figure 12:
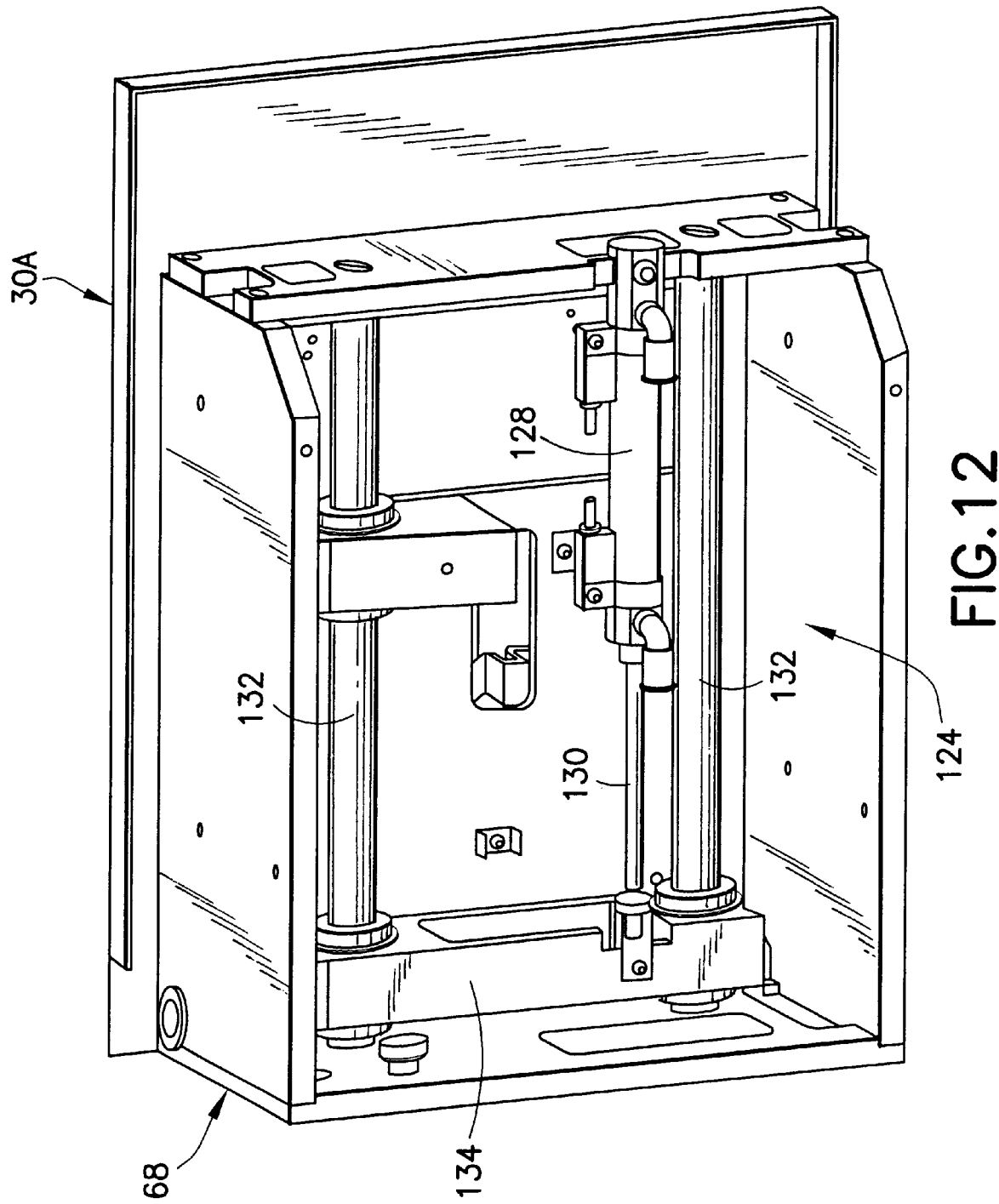
FIG. 12 is a perspective view of the underside of the modified platform illustrated in FIG. 11.

For the description of another embodiment of the invention, turn now especially to FIGS. 2A, 8A, 11, and 12. In this instance, a modified platform 30A is suitably mounted on the stage 68 and is provided with an upper surface 32A adapted to receive a cassette 34 as in the earlier described embodiment. However, unlike the earlier described embodiment, the cassette 34 is received on the upper surface 32A containing a plurality of the semiconductor wafers 36 in a substantially horizontal or level orientation (see FIG. 2A) rather than in an upright orientation. With the cassette so positioned, the platform 30A is movable in plane on the stage 68 in directions represented by a double headed arrow 126 (FIGS. 2A and 8A) between a withdrawn position distant from the charging opening 28 and an advanced position proximate the charging opening. An actuating mechanism 124 for moving the platform between the withdrawn position and the advanced position is illustrated in FIG. 12. The actuating mechanism 124 includes a platform actuator 128 mounted on the stage 68 and having an actuator rod 130 fixed to the platform at a location distant from the platform actuator for moving the platform between the withdrawn position distant from the charging opening and the advanced position proximate the charging opening. A pair of parallel guide rods 132 fixed on the stage 68 slidably engage with a double bored guide sleeve 134 integral with the platform 30A to assure proper directional movement of the platform as it moves between the advanced and withdrawn positions.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A system for loading and unloading semiconductor wafers adjacent a process tool comprising:

a platform having an upper surface for receiving thereon a cassette adapted to support therein a plurality of the semiconductor wafers to be passed though a charging opening in communication with the reception region of the process tool, the platform including a cassette cradle and a tilt assembly for moving the cassette cradle with the cassette thereon from a first location at which the semiconductor wafers are supported in a substantially upright orientation to a second location adjacent the reception region into the process tool such that the plurality of wafers are supported in a substantially level orientation;

wherein the cassette cradle includes a base for initially receiving the cassette thereon, an integral back wall extending in a plane transverse to the base, and an arbor pivotally mounting the cassette cradle about an axis parallel to a line of intersection between the base and the back wall for moving the cassette between the first location and the second location whereat the cassette is supported on the back wall;

a selectively operable closure movable between a first position withdrawn from the charging opening allowing the passage therethrough of the semiconductor wafers and a second position overlying the charging opening preventing the passage therethrough of the semiconductor wafers;

a shroud movable between a retracted position fully exposing the platform and the cassette received thereon and an advanced position fully encompassing the platform and the cassette received thereon adjacent the process tool to serve as a barrier against the passage of particulate matter into the process tool;

a cassette cradle crank interconnecting the cassette cradle and the arbor; and an actuating mechanism for rotating the cassette cradle crank about the axis of the arbor, the actuating mechanism including a rotary actuator, a drive link driven by the rotary actuator about a drive axis parallel to and spaced from the axis of the arbor, and a connecting link pivotally connected at opposed ends, respectively, to the cassette cradle crank at a position spaced from the arbor axis and to the drive link at a position spaced from the drive axis.

2. A system as set forth in claim 1 wherein the actuating mechanism is effective to move the cassette cradle through an arcuate sweep of 90° between the first and second positions in response to rotation of the drive link through an arcuate sweep of 180°.

3. A system as set forth in claim 1 including:

a cassette down sensor responsive to arrival of the cassette cradle at the second location for terminating operation of the rotary actuator.

4. A system as set forth in claim 1 including;

wherein the platform is movable in a plane between a withdrawn position distant from the charging opening and an advanced position proximate the charging opening.

5. A system as set forth in claim 4 including;

an actuating mechanism for moving the platform between the withdrawn position and the advanced position.

6. A load port module adapted to be mounted adjacent a process tool for loading and unloading, respectively, semiconductor wafers to and from the process tool comprising:

a mounting frame for attachment to the process tool and having a charging opening therein for entry into the process tool;

a platform having an upper surface for receiving thereon a cassette adapted to support therein a plurality of the semiconductor wafers to be passed though the charging opening into the process tool, the platform including a cassette cradle and a tilt assembly for moving the cassette cradle with the cassette thereon from a first location at which the semiconductor wafers are supported in a substantially upright orientation to a second location at the reception region into the process tool such that the plurality of wafers are then supported in a substantially level orientation;

wherein the cassette cradle includes a base for initially receiving the cassette thereon, an integral back wall extending in a plane transverse to the base, and an arbor pivotally mounting the cassette cradle about an axis parallel to a line of intersection between the base and the back wall for moving the cassette between the first location and the second location whereat the cassette is supported on the back wall;

a selectively operable closure movable between a first position withdrawn from the charging opening allowing the passage therethrough of the semiconductor wafers and a second position overlying the charging opening preventing the passage therethrough of the semiconductor wafers;

a shroud movable between a retracted position fully exposing the platform and the cassette received thereon and an advanced position fully encompassing the platform and the cassette received thereon adjacent the process tool to serve as a barrier against the passage of particulate matter into the process tool;

a cassette cradle crank interconnecting the cassette cradle and the arbor; and an actuating mechanism for rotating the cassette cradle crank about the axis of the arbor, the actuating mechanism including a rotary actuator, a drive link driven by the rotary actuator about a drive axis parallel to and spaced from the axis of the arbor, and a connecting link pivotally connected at opposed ends, respectively, to the cassette cradle crank at a position spaced from the arbor axis and to the drive link at a position spaced from the drive axis.

7. A load port module as set forth in claim 6 wherein the actuating mechanism is effective to move the cassette cradle through an arcuate sweep of 90° between the first and second positions in response to rotation of the drive link through an arcuate sweep of 180°.

8. A load port module as set forth in claim 6 including:
a cassette down sensor responsive to arrival of the cassette cradle at the second location for terminating operation of the rotary actuator.

9. A load port module as set forth in claim 6 wherein:
the shroud is movable between a retracted position fully exposing the cassette cradle and an advanced position fully encompassing the cassette cradle.

10. A load port module as set forth in claim 6 including:
a stage having opposed side walls and an integral end wall transverse to and extending between the side walls, the end wall being fixed on the mounting frame and the side walls extending away therefrom adjacent the charging opening; and
the platform being movable on the stage in a plane between a withdrawn position distant from the charging opening and an advanced position proximate the charging opening.

11. A load port module as set forth in claim 10 including:
a platform actuator mounted on the stage and having an actuator rod fixed to the platform at a location distant from the platform actuator for moving the platform between the withdrawn position distant from the charging opening and the advanced position proximate the charging opening.

12. A load port module as set forth in claim 6 wherein the platform is movable in a plane between a withdrawn position distant from the charging opening and an advanced position proximate the charging opening.

13. A load port module as set forth in claim 12 including:
an actuating mechanism for moving the platform between the withdrawn position and the advanced position.

14. A load port module as set forth in claim 12 including:
a stage fixed on the mounting frame and extending away therefrom adjacent the charging opening;
wherein the stage has opposed side walls; and
wherein the arbor has opposed ends mounted, respectively, in each of the opposed side walls.

15. A load port module as set forth in claim 6 including:
a stage having opposed side walls fixed on the mounting frame and extending away therefrom adjacent the charging opening; and
wherein the shroud includes:
a pair of substantially parallel side quarter panels;
an arcuate cover panel integral with and extending between the side quarter panels; and
hinge means pivotally mounting the side quarter panels to the side walls of the stage adjacent the charging opening;
the side quarter panels and the arcuate cover panel together defining a foremost rim which is substantially coplanar with the upper surface of the platform when the shroud is in the retracted position and which is proximate the mounting frame and surrounding the charging opening when the shroud is in the advanced position.

16. A load port module as set forth in claim 15 including:
an actuator mechanism for moving the shroud between the retracted position and the advanced position.

17. A load port module as set forth in claim 15 wherein the side quarter panels and the arcuate cover panel together define an aft rim distant from the foremost rim and include an operating flange integral with one of the side quarter panels and extending away from the aft rim to an extreme edge; and
including:
a shroud actuator pivotally mounted on the stage with an actuator rod pivotally connected to the operating flange adjacent the extreme edge thereof;
whereby operation of the shroud actuator effects movement of the shroud between the retracted and advanced positions.

18. A load port module as set forth in claim 15 including:
a shroud enclosure fixed to the mounting frame and to the stage and including opposed side walls and a front wall, the side walls of the shroud enclosure being generally parallel to and spaced from the side quarter panels of the shroud and the front wall of the shroud enclosure being spaced from the arcuate cover panel when the shroud is in the retracted position.

19. A load port module as set forth in claim 6 including:
an arm connected to the closure to move the closure between the first and second positions, the arm being movable in at least two different directions angled relative to each other to move the closure in the at least two different directions.

20. A load port module as set forth in claim 19 wherein the arm is rotatably connected to the frame.

21. A load port module as set forth in claim 19 wherein the arm is longitudinally movably connected to the frame.

22. A load port module as set forth in claim 19 wherein a first one of the directions comprises a generally horizontally outward direction away from the opening and a second one of the directions comprises a direction away from a horizontal path into and out of the opening.

23. A load port module as set forth in claim 19 wherein the second direction is a downward direction.

24. A load port module as set forth in claim 19 including:
a first drive connected to the arm to move the arm in a first one of the directions and a second drive connected to the arm to move the arm in a second one of the directions.

25. A load port module as set forth in claim 24 wherein at least one of the drives is a rotary motion drive.

26. A load port module as set forth in claim 24 wherein at least one of the drives is a straight linear motion drive.

* * * * *